United States Patent [19]
Ehrlich et al.

[11] Patent Number: 5,373,102
[45] Date of Patent: Dec. 13, 1994

[54] OPTICALLY TRANSMISSIVE FARADAY CAGE

[75] Inventors: John J. Ehrlich; Wayne E. Davenport, both of Huntsville; Travis S. Taylor, Somerville, all of Ala.

[73] Assignee: The United States of America as represented by the Secretary of the Army, Washington, D.C.

[21] Appl. No.: 108,274

[22] Filed: Aug. 19, 1993

[51] Int. Cl.⁵ .................................................. H05K 9/00
[52] U.S. Cl. ............................. 174/35 R; 174/35 MS; 428/333
[58] Field of Search ...................... 174/35 R, 35 MS; 428/34, 334, 333, 458, 432, 434, 192, 212–215

[56] References Cited

U.S. PATENT DOCUMENTS

| | | | |
|---|---|---|---|
| 4,412,255 | 10/1983 | Kuhlman et al. | 358/245 |
| 4,613,530 | 9/1986 | Hood et al. | 428/34 |
| 4,631,214 | 12/1986 | Hasegawa | 428/68 |
| 4,978,812 | 12/1990 | Akeyoshi et al. | 174/35 MS |
| 5,012,041 | 4/1991 | Sims et al. | 174/35 MS |
| 5,017,419 | 5/1991 | Smith | 428/209 |
| 5,136,119 | 8/1992 | Leyland | 174/35 R |
| 5,147,694 | 9/1992 | Clarke | 428/34 |

Primary Examiner—Leo P. Picard
Assistant Examiner—Christopher Horgan
Attorney, Agent, or Firm—Anthony T. Lane; Hugh P. Nicholson; Fred M. Bush

[57] ABSTRACT

The structure of this invention provides a means for shielding an optically sensitive detector, device, or components from electromagnetic fields without shielding them from the optical spectra desired to be transmitted. The structure of the invention is in the form of an optically transmissive Faraday cage or box having optically transparent material selected from optical glass and optically transparent plastic which functions as a substrate. The substrate is provided a thin film of predetermined skin depths in the form of a conductive coating selected from silver and a nickel-chromiumiron-manganese-silicon-copper-alloy. The conductive coating is applied in a thickness equivalent to a predetermined number of skin depths in order to attenuate an external electromagnetic field strength to meet the tolerance of the detector, device, or components which are to be shielded.

2 Claims, 1 Drawing Sheet

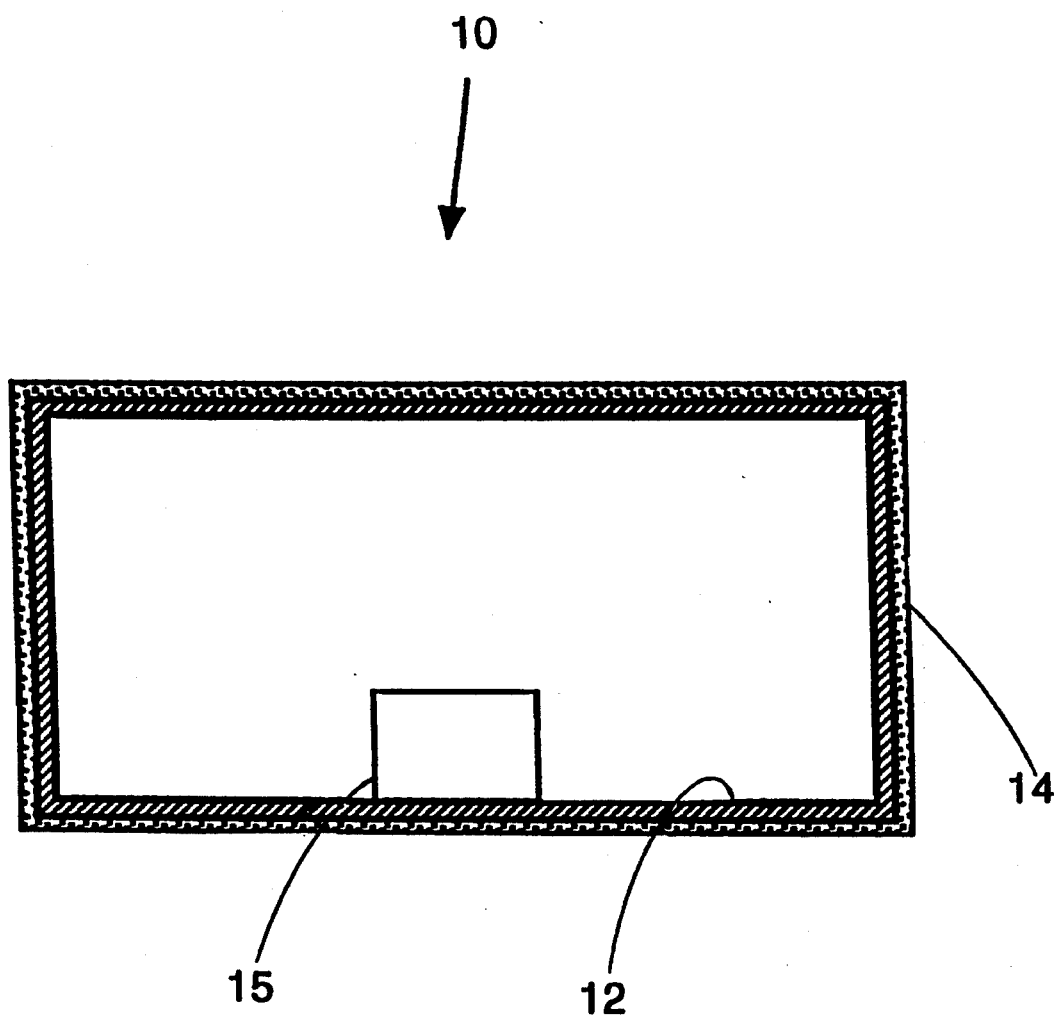

OPTICALLY TRANSMISSIVE FARADAY CAGE

The invention described herein may be manufactured, used, and licensed by or for the Government for governmental purposes without the payment to us of any royalties thereon.

BACKGROUND OF THE INVENTION

The term shield as applied to radiation is defined as any material used to reduce the amount of radiation reaching one region of space from another region of space. An electrostatic shield when made of a series of parallel wires connected at one end and grounded from a common point is generally referred to as a Faraday shield or screen. One embodiment of an electrostatic shield which is also termed a Faraday shield is constructed of a series of parallel wires connected at one end like a comb. The common point is grounded. This structure of a Faraday shield provides electrostatic shielding while passing electromagnetic waves.

Present day shielding requirements in view of the use of the selected portions of the spectra in optical signalling and communication necessitates shielding from electromagnetic fields without shielding from the optical spectrum. Optical communication (opcom) is communication over relatively short distances by means of beams of visible, infrared, or ultraviolet radiation, or over much longer distances with laser beams.

Thus, there are some instances when optical information is being transmitted to an optically sensitive detector which is in an environment where the electromagnetic field strength around the detector is too great for the detector to function properly. In these instances the detectors must be shielded from the electromagnetic radiation. The typical shielding techniques involve building a Faraday cage shield out of conducting material. However, conducting materials are typically opaque to any optical signal. Therefore, in order to protect an optically sensitive detector from strong electromagnetic fields, the optical signal would also be shielded from the detector.

A primary object of this invention is to provide a shield structure which is an effective shield for electromagnetic fields without shielding the desired optical spectrum.

A further object of this invention is to provide a shield structure which employs optical thin film technologies while utilizing the Faraday cage effect for shielding a device from electromagnetic fields without shielding the device from the desired optical spectrum.

Still a further object of this invention is to provide an optically transmissive shield which is opaque to lower frequency signals.

SUMMARY OF THE INVENTION

A shielding structure in the form of a box is constructed of optically transparent material (e.g., glass, methyl methacrylate, acrylic resin, acrylic sheet, etc.) which functions as a substrate for a metal coating as further defined hereinbelow. The outer surfaces of the transparent box or substrates are coated with a conducting optically transmissive thin film selected from the group selected from silver and a nickel-chromium-iron-manganese-silicon-copper-alloy (Inconel, a trademark for Ni-Cr-Fe-Mn-Si-Cu-alloy of International Nickel Company). The box is constructed to meet the physical size requirements of the components which need shielding. The conducting optically transmissive thin film is of a predetermined thickness defined in terms of skin depths, a well defined term employed in attenuation of an external field. The attenuations of an external field for one, two, and three skin depths are about 87%, 98%, and 99.8%, respectively. Thus, the thickness of the conducting thin film for the optically transmissive Faraday cage, which is the named structure comprised of a transparent box with a conducting thin film coating thereon, is determined from the strength and frequency spectrum of the electromagnetic field and the tolerance of the device or components which is to be shielded.

BRIEF DESCRIPTION OF THE DRAWING

The single Figure of the Drawing depicts an optically transmissive Faraday cage comprised of a box constructed of transparent material with an optically transparent thin film conductive coating.

DESCRIPTION OF THE PREFERRED EMBODIMENT

An optically transmissive Faraday cage is constructed in accordance with this invention to shield an optically sensitive detector, device, or components from strong electromagnetic fields while allowing optical signals of the spectrum ranges of ultraviolet (UV), visible, and infrared (IR) (near, middle, and far infrared to pass).

In further reference to the Figure of the Drawing, an optically transmissive Faraday cage 10 is depicted which comprises a box 12 made of transparent material of a substrate material selected from glass, methyl methacrylate, acrylic resin, acrylic sheet, etc. An optically transparent thin film conductive coating 14 is depicted on the external surfaces of the box. A detector 15 is depicted for receiving optical signals transmitted through the optically transparent shield. The conducting optically transmissive thin film is selected from silver and nickel-chromium-iron-manganese-silicon-copper-alloy (Inconel, a trademark for Ni-Cr-Fe-Mn-Si-Cu-alloy of International Nickel Company).

The box 12 is constructed to meet the physical size requirements of the components which need shielding. The transparent box is then coated with a conducting optically transmissive thin film (e.g., Inconel, silver, etc.). The thin film must be on the order of one skin depth of the conducting material in order to attenuate an external electromagnetic field by 87%. Two skins depths will attenuate an electromagnetic field by about 98%, and three skin depths will reduce an electromagnetic field by about 99.8%. A discussion of skin depth and its relationship to neper, also called napier, is set forth hereinabove. According to the strength and frequency spectrum of the external electromagnetic field and the tolerance of the device which is to be shielded, the thickness of the conducting thin film for the optically transmissive Faraday cage can be determined while also taking into account the spectra wavelength transparency required for a device such as an optical detector.

The "Electronics and Nucleonics Dictionary", Third Edition, by John Markus defines skin depth as: "the depth below the surface of a conductor at which the current density has decreased one neper below the current density at the surface due to the action of the electromagnetic waves associated with the high-frequency current flowing through the conductor." The term neper is also defined in the above identified dictionary as: "a unit used to express the ratio of two voltages, two currents, or two power values in a logarithmic manner. The number of nepers is the natural (Napierian) logarithm of the square root of the ratio of the two values being compared. The neper thus uses the base of 2.71828, whereas the decibel uses the common-logarithm base of 10. One neper is equal to 8.686 decibels." The correlation of the definitions of skin depth and neper or napier unit with the specification for this invention should provide a better understanding of the teachings and disclosures thereof.

Table I set forth hereinbelow provides the spectrum, UV, visible, and IR with wavelength ranges in nanometers (nm) and in microns (μ) which the optically transmissive Faraday cage is constructed to be transmissive to selected optical signals while being opaque to lower frequency signals of electromagnetic radiation.

TABLE I

| | SPECTRUM UV VISIBLE AND IR | |
|---|---|---|
| Spectrum | Range Wavelength in nm | Range Wavelength in μ |
| UV | 20–380 | 0.02–0.38 |
| Visible | 397–723 | 0.397–0.723 |
| IR (near) | 750–1500 | 0.750–1.5 |
| IR (middle) | 1500–10,000 | 1.5–10 |
| IR (far) | 10,000–1,000,000 | 10–1,000 |

At the extremes of the spectra of Table I the cutoff value for UV is indicated to be a wavelength of 280 nm–0.28μ, and the cutoff value for IR (far) is indicated to be a wavelength of 10,000–12,000 nm or 10–12μ. These values are based on the state of the art optical glass and plastics available to achieve transmissibility of desired optical signals while achieving opacity to lower frequency signals. Thus, according to the strength and the frequency of the external electromagnetic field and the tolerance of the device which is to be shielded, the thickness of the conducting thin film for the transmissive Faraday cage can be constructed for maximum shielding and transmissibility.

We claim:

1. An optical transmissive shield for an optically sensitive detector or device and components thereof which attenuates an external electromagnetic field while being transmissive to optical signals, said optically transmissive shield comprising:

(i) a transparent box of a predetermined size to meet the physical size requirements of said optically sensitive detector or device and components thereof, said transparent box having external surfaces which function as external substrates for a conducting optically transmissive thin film applied to said external substrates, said transparent box constructed of an optically transparent material selected from the group consisting of glass, acrylic resin, methyl methacrylate, and acrylic sheet;

(ii) a conducting optically transmissive thin film of a nickel-chromium-iron-manganese-silicon-copper-alloy applied in skin depths of one, two or three on said external substrates for shielding said optically sensitive detector or device and components thereof to said external electromagnetic field while allowing optical signals of the spectra of ultraviolet, visible, infrared near, infrared middle, and infrared far to pass, said optical signals having wavelength ranges in microns of 0.02–0.38, 0.397–0.723, 0.750–1.5, 1.5–10, and 10.0–12.0, respectively.

2. The optically transmissive shield as defined in claim 1, wherein said optically transparent material selected is methyl methacrylate and wherein said nickel-chromium-iron-manganese-silicon-copper-alloy is applied in said skin depths of one, two, or three to achieve attenuation of said external electromagnetic field by 87%, 98%, or 99.8%, respectively.

* * * * *